United States Patent

Klippel et al.

[11] Patent Number: 6,031,368
[45] Date of Patent: Feb. 29, 2000

[54] SENSING APPARATUS FOR CABLE TERMINATION DEVICES IN POWER DISTRIBUTION SYSTEMS

[75] Inventors: Todd W. Klippel, Chicago; Roy T. Swanson, La Grange Park, both of Ill.

[73] Assignee: S&C Electric Company, Chicago, Ill.

[21] Appl. No.: 08/712,822

[22] Filed: Sep. 12, 1996

[51] Int. Cl.⁷ ................................................. G01R 27/26
[52] U.S. Cl. .......................... 324/133; 439/951; 324/126
[58] Field of Search ...................... 324/133, 127, 324/126; 340/660; 333/24 C; 439/950, 951

[56] References Cited

U.S. PATENT DOCUMENTS

| | | | |
|---|---|---|---|
| 3,372,334 | 3/1998 | Fenoglio | 324/126 |
| 3,970,932 | 7/1976 | Harvey | 324/133 |
| 3,991,367 | 11/1976 | Chapman | 324/133 |
| 4,002,976 | 1/1977 | Zulaski | 324/121 |
| 4,794,331 | 12/1988 | Schweitzer | 324/133 |
| 5,051,733 | 9/1991 | Neuhouser | 324/133 |
| 5,065,142 | 11/1991 | Green | 324/133 |
| 5,166,600 | 11/1992 | Gorablenkow | 324/126 |
| 5,180,972 | 1/1993 | Schweitzer | 324/133 |
| 5,220,495 | 6/1993 | Zulaski | 324/126 |
| 5,418,450 | 5/1995 | Bacon | 324/126 |
| 5,650,772 | 7/1997 | Schmidt | 324/133 |
| 5,726,608 | 3/1998 | Arlin | 333/24 C |
| 5,796,315 | 8/1998 | Gordon | 333/24 C |

*Primary Examiner*—Maura Regan
*Attorney, Agent, or Firm*—James V. Lapacek

[57] ABSTRACT

Coupling apparatus is provided for assembly with separable insulated connector components on power cables for power distribution systems. The coupling apparatus provides either direct or indirect coupling, e.g. to provide interconnection to the connector components or to provide a sensing point. In one illustrative embodiment, the coupling apparatus is installed in place of a conventional double-ended plug that is required to piggyback T-body elbows, i.e. where multiple elbows are to be connected. In one specific arrangement, the coupling apparatus includes a desired connector interface. In another specific arrangement, a sensed voltage output is provided using components such as capacitive coupling components, capacitors, resistors or transformers. In another embodiment, the coupling apparatus is used in place of a conventional insulating plug that is used to attach a T-body elbow to a bushing, e.g. on switchgear assemblies or the like. In a specific arrangement, the coupling apparatus is a voltage sensor and provides a sensed voltage output derived from a capacitive coupling arrangement utilizing a capacitive divider. In a preferred form, the voltage sensor also encapsulates circuitry to provide a low impedance output signal that is directly proportional to the sensed voltage.

17 Claims, 4 Drawing Sheets

SENSING APPARATUS FOR CABLE TERMINATION DEVICES IN POWER DISTRIBUTION SYSTEMS

BACKGROUND OF THE INVENTION

1. Field of the Invention

The present invention relates generally to electrical coupling apparatus and sensors for the electrical power distribution field and more particularly to coupling apparatus for assembly with separable insulated connector components on power cables in power distribution systems.

2. Description of Related Art

Various apparatus have been proposed for use in making electrical connections and for sensing electrical parameters such as voltage and current in medium-voltage electrical power distribution systems. For example, this apparatus is useful to provide electrical connections and also to provide data for automated distribution systems, phasing information, troubleshooting of faulted cables, etc. Some of these arrangements utilize separable insulated connectors on power cables while others provide receiving passages through which the energized electrical cables are passed. Still other arrangements provide coupling/sensor assemblies that interfit with the conventional test point caps of elbows for cable terminations. Some of these devices utilize transformers, pick-up coils, resistive dividers and capacitive coupling to sense circuit parameters. One device, available from Lindsey Manufacturing Company of Azusa, Calif. as the Elbow Sense™ Voltage Monitoring Plug, utilizes a voltage monitoring plug that replaces the standard plug on 600 ampere elbow assemblies, commonly referred to as "T-body" elbows. This arrangement utilizes a precision resistive voltage divider to provide an output proportional to line-to-ground voltage. Another device available from Lindsey Manufacturing Co. is a VSB Voltage Sensing Bushing that utilizes a capacitive voltage divider. This interface bushing device is arranged to be directly affixed to a switchgear tank or the like, replacing the existing bushing that interfits with the cable-terminating elbow devices such as the 600 ampere T-body components.

Devices which capacitively couple to the test point of an elbow connector are exemplified by U.S. Pat. Nos. 4,814,933, 5,077,520 and 5,095,265.

Arrangements which utilize electrodes spaced from a cable are shown in U.S. Pat. Nos. 3,970,932, 3,991,367, 4,823,022, and 5,051,733.

Another type of voltage sensor, shown in U.S. Pat. No. 4,002,976, utilizes a capacitor having one end directly in contact with a high voltage terminal and a step-down transformer in series with the capacitor, the output of the secondary of the step-down transformer providing a voltage proportional to the terminal voltage.

While the prior art arrangements may be useful to couple electrical circuits and/or provide voltage and current information in power distribution systems, it would be desirable to provide coupling/sensing devices which interface with separable insulated connector components and are more versatile and less expensive and cumbersome.

SUMMARY OF THE INVENTION

Accordingly, it is a principal object of the present invention to provide coupling apparatus for separable insulated connector components so as to couple to separable insulated connector components for power cables in an economical and simple fashion with ease of assembly.

It is another object of the present invention to provide voltage sensor apparatus in place of the insulating plug for separable insulated connector components, e.g. either in place of an insulating plug of a T-body elbow or in place of a double-ended plug that is used to "piggyback" 600 ampere elbows.

It is a further object of the present invention to provide a voltage sensor utilizing capacitive coupling that replaces the insulating plug used in attaching a T-body elbow to a bushing.

It is yet another object of the present invention to provide a voltage sensor for separable electrical connectors on power cables that replaces the double-ended plug used to piggyback T-body elbows.

These and other objects of the present invention are efficiently achieved by the provision of coupling apparatus for assembly with separable insulated connector components on power cables for power distribution systems. The coupling apparatus provides either direct or indirect coupling, e.g. to provide interconnection to the connector components or to provide a sensing point. In one illustrative embodiment, the coupling apparatus is installed in place of a conventional double-ended plug that is required to piggyback T-body elbows, i.e. where multiple elbows are to be connected. In one specific arrangement, the coupling apparatus includes a desired connector interface. In another specific arrangement, a sensed voltage output is provided using components such as capacitive coupling components, capacitors, resistors or transformers. In another embodiment, the coupling apparatus is used in place of a conventional insulating plug that is used to attach a T-body elbow to a bushing, e.g. on switchgear assemblies or the like. In a specific arrangement, the coupling apparatus is a voltage sensor and provides a sensed voltage output derived from a capacitive coupling arrangement utilizing a capacitive divider. In a preferred form, the voltage sensor also encapsulates circuitry to provide a low impedance output signal that is directly proportional to the sensed voltage.

BRIEF DESCRIPTION OF THE DRAWING

The invention, both as to its organization and method of operation, together with further objects and advantages thereof, will best be understood by reference to the specification taken in conjunction with the accompanying drawing in which.

DETAILED DESCRIPTION

Figure 1:
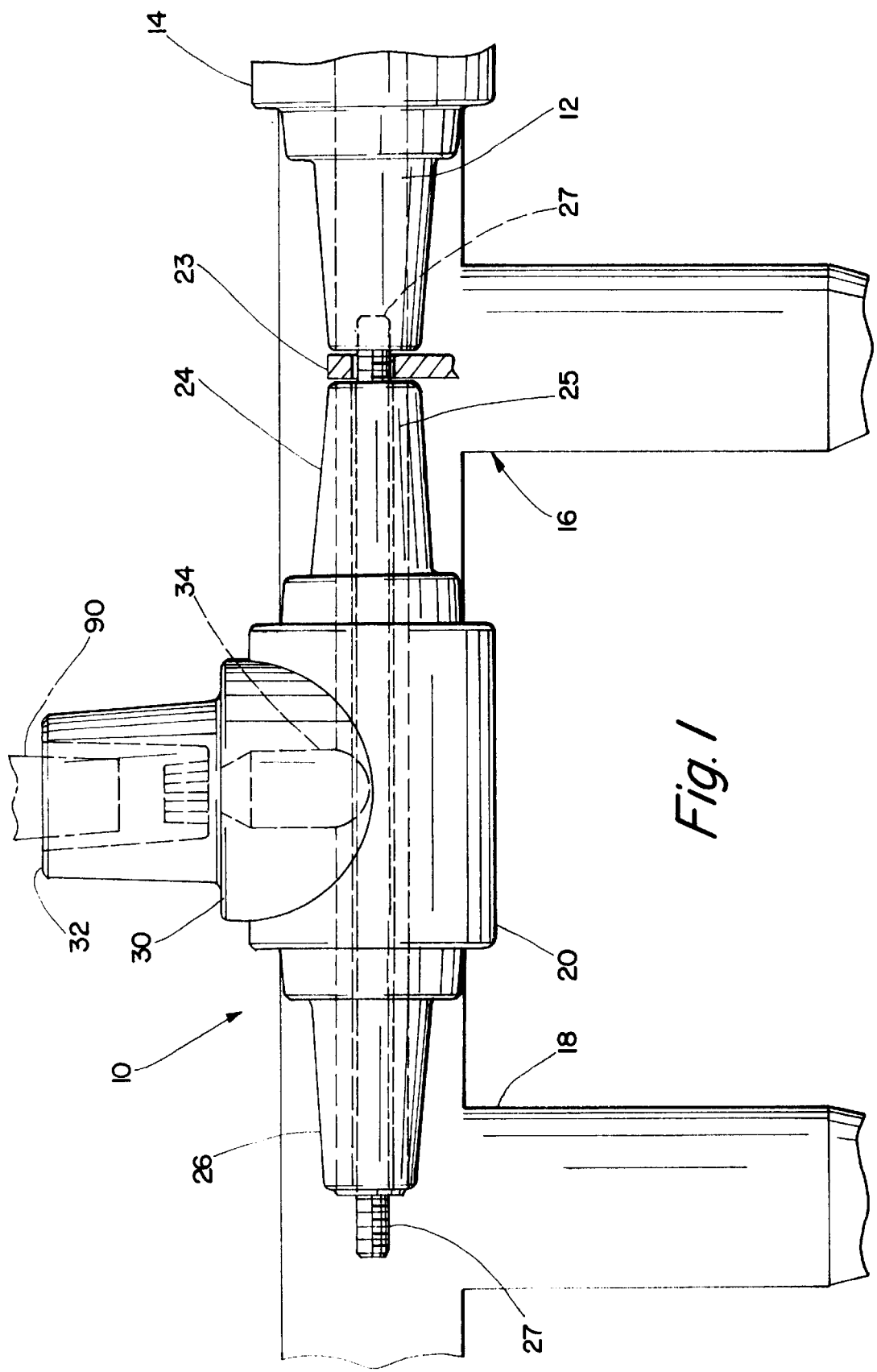
FIG. 1 is an elevational view of coupling apparatus in accordance with a first embodiment of the present invention to be used with components of a separable insulated connector system.

Referring now to FIG. 1, a coupling apparatus 10 in accordance with a first embodiment of the present invention is utilized to couple to a conductor 12 of a separable insulated connector component, such as the illustrated bushing 14 in the T-body elbow 16, which in a specific example is in accordance with ANSI/IEEE Standard 386. In this illustrative arrangement, the coupling apparatus 10 replaces a conventional double-ended plug for attachment of the T-body elbow 16 and a second T-body elbow 18. The coupling apparatus 10, preferably fabricated as a molded body of insulating material, includes a first portion 20, having the same general external shape as a conventional double-ended plug, including operating interface portions 24, 26 and a second portion 30 extending generally transverse to the first portion 20 and including the illustrated bushing well 32, or a connector interface, to define a predetermined coupling point. The first portion 20 includes a tubular conductor 23 disposed therein which defines a bore 25. A threaded rod 27 extends through the bore 25 and serves to fasten the coupling apparatus 10 to the T-body elbow 16. It should be noted that in FIG. 1, the clearance between the bore 25 and the threaded rod 27 has been exaggerated for clarity. The bushing well 32 includes a conductor portion 34 which is electrically connected to the tubular conductor 23.

During installation of the coupling apparatus 10, the threaded rod 27 is inserted into the T-body and threaded into the bushing 14, and then the coupling apparatus 10 is assembled over the threaded rod 27. Thus, the coupling apparatus 10 does not need to be rotated during at any time during the installation thereof to the separable insulated connector components. Further assembly of the T-body elbow 18 is according to conventional practice. If a second T-body elbow 18 is not required, an insulating cap may be used over the left interface portion 61 of FIG. 2 or 26 of FIG. 1.

Figure 2:
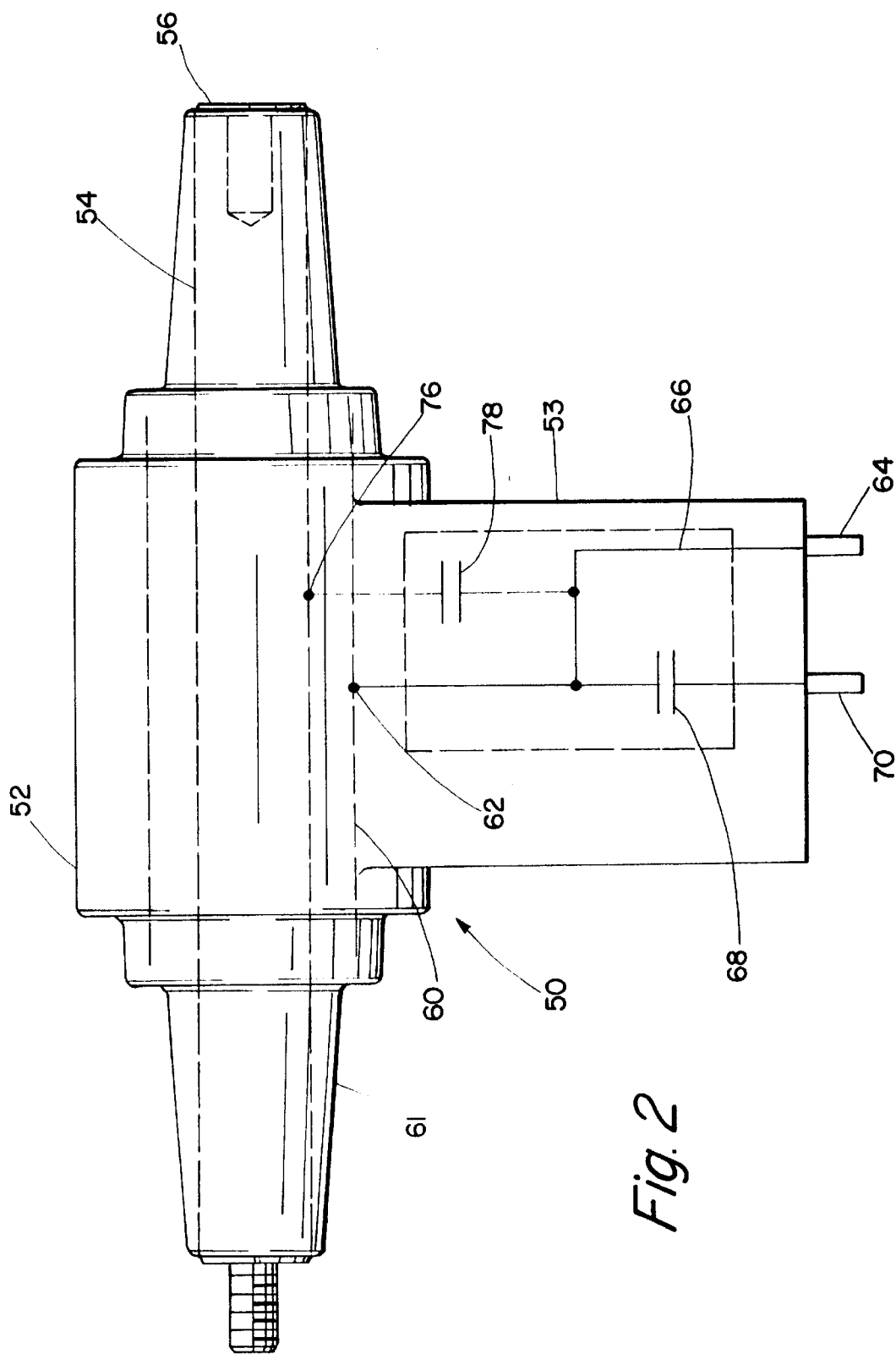
FIGS. 2 and 3 are respective front and right side elevational views of a second embodiment of the coupling apparatus in accordance with the present invention.
Figure 3:
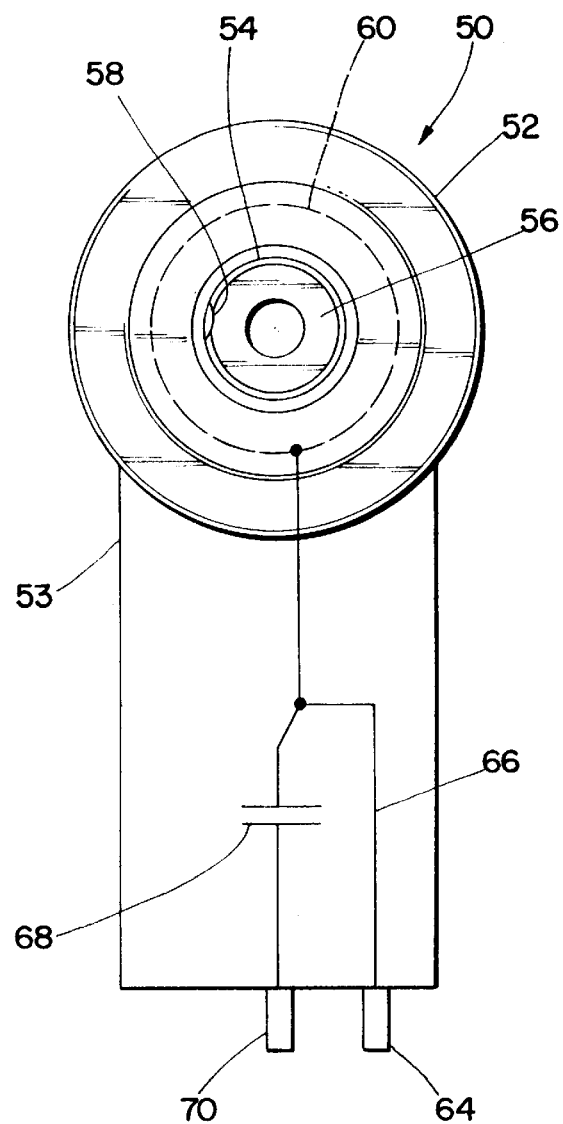

In accordance with a second embodiment of the present invention and referring now additionally to FIGS. 2 and 3, coupling apparatus 50 is also arranged to replace a conventional double-ended plug in separable insulated connector systems for power cables. In a first specific arrangement, the coupling apparatus 50, preferably fabricated as a molded body, has a first portion 52 which has the same general exterior shape as a conventional double-ended plug and a second portion 53 extending generally transverse to the first portion 52. The first portion 52 includes a central conductive sleeve 54 which is dimensioned to receive a central conductor 56. In one specific arrangement, one or more spring contact members 58 (FIG. 3) are arranged between the central conductive sleeve 54 and the central conductor 56 to provide electrical contact therebetween. In another specific arrangement, the central conductive sleeve 54 is resilient to provide suitable contact with the central conductor.

During installation into the separable insulated connector system, the central conductor 56 is inserted into the T-body elbow (e.g. 16 of FIG. 1) and threaded into the bushing (14 of FIG. 1), and then the coupling apparatus 50 is assembled over the central conductor 56. Thus, the coupling apparatus 50 is not rotated during installation.

In a specific arrangement, the coupling apparatus 50 includes a capacitance pickup member 60, e.g. as illustrated in FIGS. 2 and 3, arranged as a cylindrical shell or sleeve. An electrical connection at 62 to the capacitance pickup member 60 is provided to define a coupled output at 64 via electrical conductor 66. Preferably, a capacitor 68 is provided in the second portion 53 that is connected between the output 64 and ground at 70, such that the output 64 is at the midpoint of a capacitive bridge, defined by the capacitor 68 and the capacitance pickup member 60.

Figure 4:
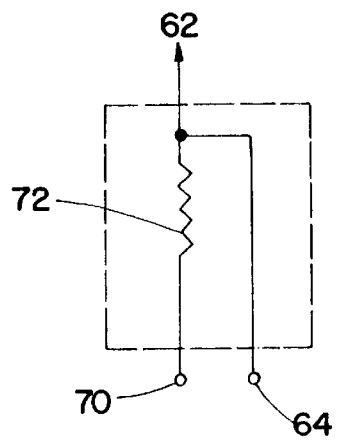
FIGS. 4, 5 and 8 are electrical schematic representations of circuits and components of the coupling apparatus of FIGS. 2 and 3.
Figure 5:
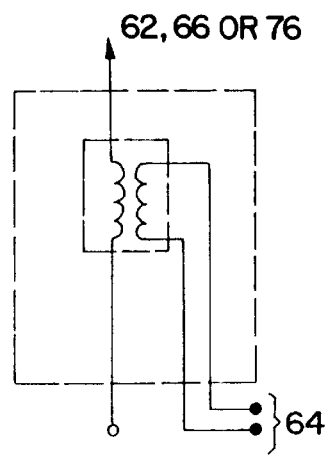
Figure 8:
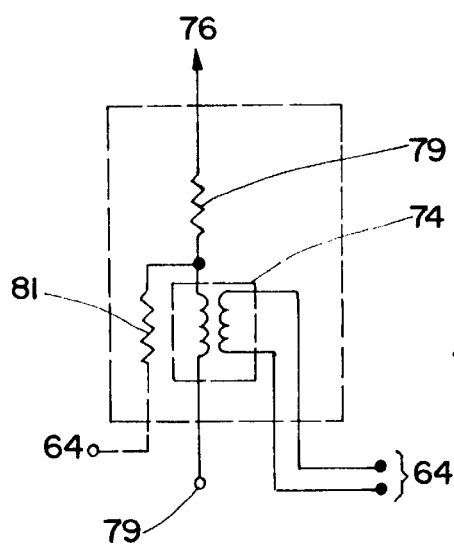

Referring additionally to FIGS. 4 and 5, in other specific arrangements, the coupling apparatus 50 includes an output circuit defined by a resistor 72 in lieu of the capacitor 68, or a transformer 74. In accordance with other specific arrangements, a direct connection at 76 is made to the central conductive sleeve 54. In that specific arrangement, as shown in FIG. 2, a capacitor 78 is provided (in lieu of the capacitance pickup member 60) so that the output 64 is at the tap of a capacitive divider formed by the capacitors 78 and 68. As noted in FIG. 5, the transformer 74 in a specific arrangement is connected to the direct connection at 76, with the capacitor 68 being deleted. Also, the transformer 74 in another specific arrangement is connected to the capacitor 78 at the conductor 66 (i.e. in lieu of capacitance pickup member 60 and the capacitor 68). Referring additionally to FIG. 8, in another specific embodiment, a resistive divider of resistors 79 and 81 is directly connected to the point 76 and ground 70. In yet another specific embodiment, a resistor 79 and a transformer 74 are connected between the point 76 and ground 70.

It should also be understood that in various specific arrangements of the coupling apparatus 10 of FIG. 1, the circuits and components as discussed in connection with FIGS. 2–5 are utilized to provide desired output characteristics and configurations, for example via a bushing insert 90 or the like connected at the bushing well 32 or a connector interface.

Figure 6:
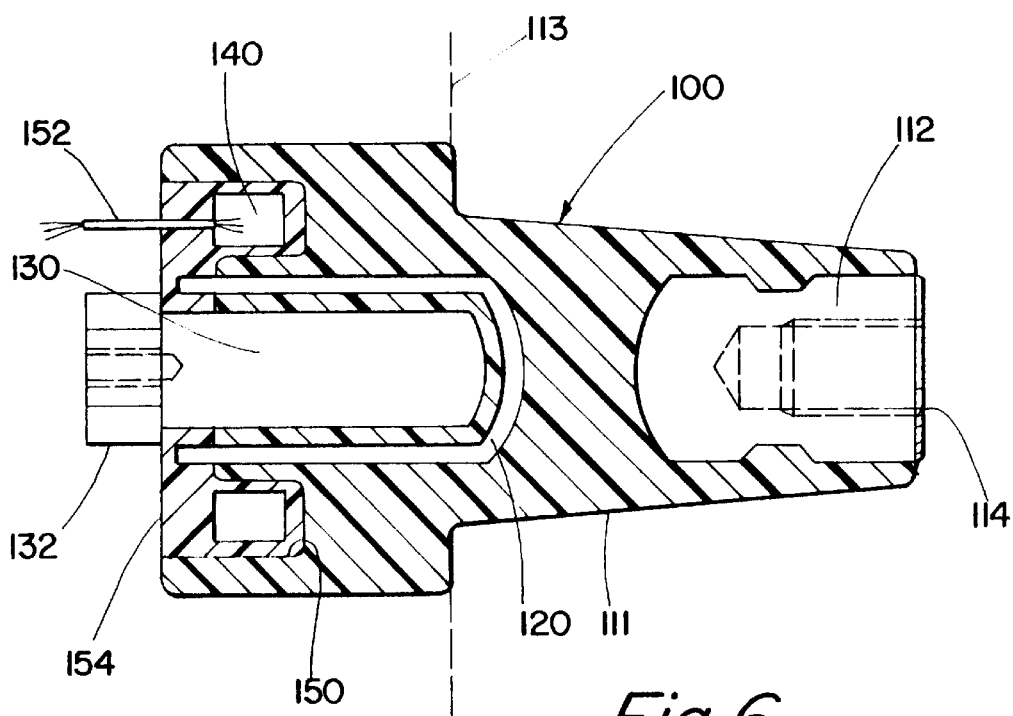
FIG. 6 is an elevational view, partly in section, of a third embodiment of coupling apparatus in accordance with the present invention.
Figure 7:
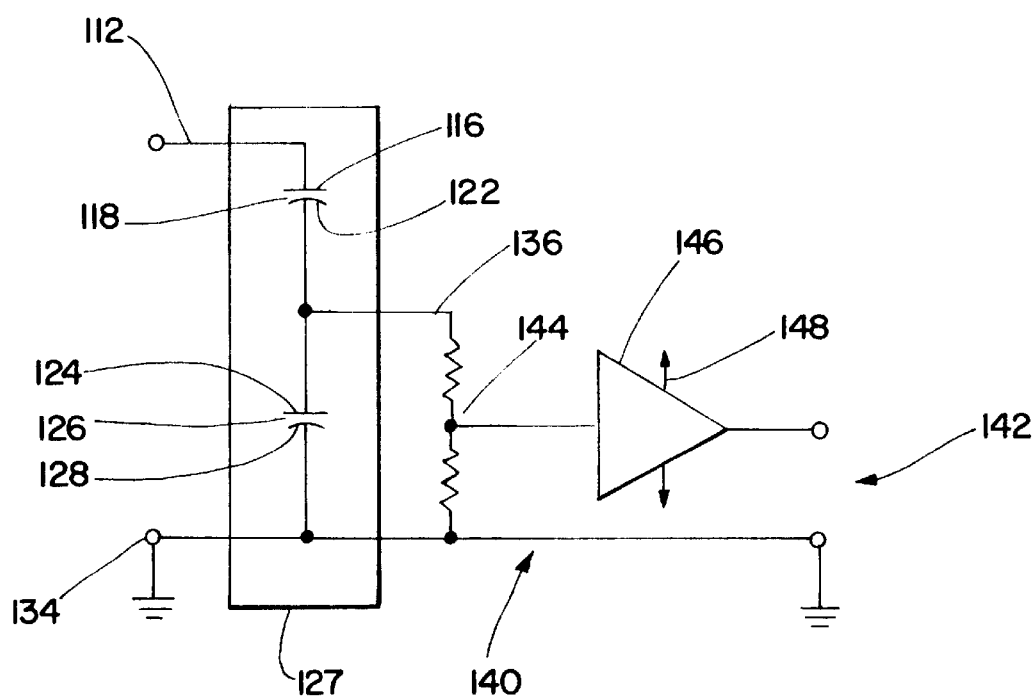
FIG. 7 is an electrical schematic representation of circuitry and components of the coupling apparatus of FIG. 6.

In accordance with other important aspects of the present invention and referring now to FIGS. 6 and 7, a coupling apparatus 100 of the present invention is provided to take the place of a component of a separable insulated connector system, e.g. in lieu of a conventional insulating plug that is used to attach or assemble a T-body elbow to a bushing on a switchgear tank or the like. In one specific arrangement, the T-body elbows and the bushings are in accordance with ANSI/IEEE Standard 386. For example, the coupling apparatus 100 is inserted into the rear end of a T-body elbow which has been placed over a bushing and threaded onto the stud extending from the bushing and through the T-body elbow.

Specifically, the coupling apparatus 100 includes a body 110 in the overall shape of a conventional insulating plug and a connector 112 with threaded passage 114 for threadingly engaging a conventional threaded stud that extends through the bushing and the T-body elbow. The connector 112 is conductive and arranged to form a first plate 116 (FIG. 7) of a first capacitor 118 of the coupling apparatus 100. A closed cylindrical sleeve 120 of conductive material forms a second plate 122 of the capacitor 118 and also a first plate 124 of a second capacitor 126, the capacitors 118 and 126 forming a capacitive voltage divider 127 with output 136 as seen in FIG. 7. A second plate 128 of the capacitor 126 is formed by a cylindrical conductor 130 which is connected to a ground reference, e.g. earth ground at 134 (FIG. 7).

The elements 112, 120 and 130 are fabricated and arranged along with the material of the body 111 to provide an accurate capacitive divider 127 and output 136 which is also isolated from the high voltage connection at 112. Considering the circuit of FIG. 7, the output 136 of the capacitive divider 127 is connected through electronic circuitry components generally referred to at 140 to provide a low voltage output at 142 that is directly proportional to the sensed voltage at 112. Specifically, in an illustrative embodiment, a resistive divider 144 and an amplifier 146 are utilized to provide a suitable output at 142.

The body 111 is electrically insulating and preferably molded from an insulating epoxy or other suitable polymeric material, with a conductive coating being provided to the left of the line 113 in FIG. 6. The body 111 is formed with a circumferential recess 150. The circuit components 140 are disposed within the recess 150 with the output 142, a ground reference 134, and power supply connections 148 (FIG. 7) being provided via conductors in a cable 152. The components 140 are sealed within the recess 150 by a potting compound 154 or the like. The hex nut 132 is utilized as a connection point to earth ground and also provides for attachment of tools to facilitate threading of the coupling apparatus 100 onto the conventional T-body components and hardware, e.g. the conventional stud that extends from the bushing and through the T-body elbow. As previously discussed, the coupling apparatus 100 is usable as a direct replacement for the conventional insulating plug for T-body elbows.

While there have been illustrated and described various embodiments of the present invention, it will be apparent that various changes and modifications will occur to those skilled in the art. Accordingly, it is intended in the appended claims to cover all such changes and modifications that fall within the true spirit and scope of the present invention.

What is claimed and desired to be secured by Letters Patent of the United States is:

1. Coupling apparatus for separable insulated connector components comprising a formed body fabricated from an insulating material, first means carried by said formed body for interconnecting with an energized conductor of a separable insulated connector component in place of an insulating plug or double-ended plug, second means disposed within said formed body and spaced apart from the energized conductor and said first means for providing predetermined capacitive coupling characteristics to the energized conductor, and third means responsive to said second means for providing a coupled output at a predetermined interface, said second means comprising two conductive members within said formed body that are spaced apart from each other and also from said energized conductor and said first means such that said first and second means define a capacitive divider, said third means comprising electronic circuit components disposed within said formed body and electrical interconnection means for connecting an external power supply to said electronic circuit components.

2. The coupling apparatus of claim 1 wherein said electronic circuit components comprise an amplifier arranged in circuit to provide a low impedance output.

3. The coupling apparatus of claim 1 wherein said first of said two conductive members is a generally cylindrical shell with a first base that faces said first means.

4. The coupling apparatus of claim 3 wherein said second of said two conductive members is disposed within said generally cylindrical shell of said first of said two conductive members.

5. The coupling apparatus of claim 4 wherein said second of said two conductive members is connected to a reference potential.

6. The coupling apparatus of claim 1 wherein said formed body comprises a first portion that is of the same general shape as a double-ended plug for T-body elbows.

7. The coupling apparatus of claim 6 wherein said formed body includes a central passage dimensioned for passage of a threaded rod.

8. The coupling apparatus of claim 7 wherein said threaded rod includes characteristics of the type utilized with the separable insulated connector components.

9. The coupling apparatus of claim 7 wherein said first means comprises conductive means forming said central passage.

10. The coupling apparatus of claim 1 wherein said formed body further comprises a second portion extending transverse to said first portion and housing said second and third means.

11. Voltage sensor apparatus for interfitting with a component of a separable insulated connector system comprising a formed body fabricated from an insulating material, first means carried by said formed body for interconnecting with an energized conductor of the component of the separable insulated connector system, second means disposed within said formed body and spaced apart from the energized conductor and said first means for defining predetermined capacitive coupling characteristics to the energized conductor, and third means responsive to said second means for providing an output proportional to the voltage on the energized conductor, said second means comprising two conductive members within said formed body that are spaced apart from each other and also from said energized conductor and said first means such that said first and second means define a capacitive divider, said third means comprising electronic circuit components disposed within said formed body and electrical interconnection means for connecting an external power supply to said electronic circuit components.

12. The voltage sensor of claim 11 wherein said voltage sensor replaces an insulating plug or double-ended plug of a conventional T-body component.

13. The voltage sensor of claim 11 wherein said formed body is of the same general shape as an insulating plug for T-body elbows.

14. The voltage sensor of claim 11 wherein said electronic circuit components comprise an amplifier arranged in circuit to provide a low impedance output.

15. The voltage sensor of claim 11 wherein said first of said two conductive members is a generally cylindrical shell with a first base that faces said first means.

16. The voltage sensor of claim 15 wherein said second of said two conductive members is disposed within said generally cylindrical shell of said first of said two conductive members.

17. The voltage sensor of claim 16 wherein said second of said two conductive members is connected to a reference potential.

* * * * *